Aug. 17, 1965 F. K. HEUMANN 3,201,227

METHOD OF PREPARING READILY DECOMPOSABLE MATERIALS

Filed June 26, 1961

Inventor:
Frederick K. Heumann,
by Joseph V. Claeys
His Attorney.

United States Patent Office 3,201,227

Patented Aug. 17, 1965

3,201,227

METHOD OF PREPARING READILY DECOMPOSABLE MATERIALS

Frederick K. Heumann, Ballston Lake, N.Y., assignor to General Electric Company, a corporation of New York Filed June 26, 1961, Ser. No. 119,540
5 Claims. (Cl. 75—65)

Figure 1:
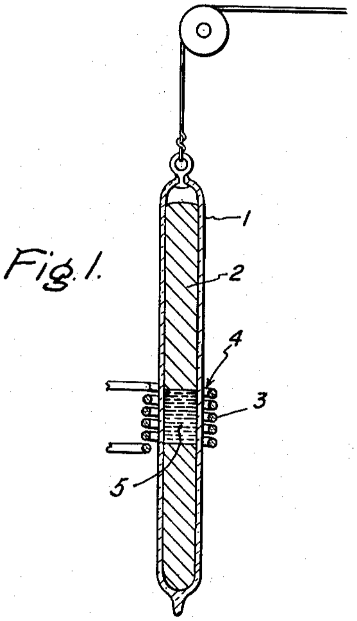

This invention relates to the preparation of readily decomposable materials and in particular to a new and simplified method of consistently preparing bodies of such materials having greatly improved compositional homogeneity.

Much difficulty has been encountered in the prior art in the preparation of homogeneous bodies of materials having volatile constituents as well as in consistently reproducing bodies of such materials having substantially the same composition. While this invention is subject to a wide range of applications it is particularly suited for the preparation of high figure of merit thermoelectric materials containing volatile constituents and will be particularly described in that connection.

The figure of merit of a thermoelectric material has been found to be a reliable indicator of the usefulness of such materials in practical applications. This figure of merit, often denominated Z, is given by the relationship $$Z=\frac{S^2}{\rho K}$$

where S is the Seebeck coefficient, sometimes called the thermoelectric power of the material, representing the electromotive force per degree difference in temperature between the hot and cold junctions of a couple suitably constructed of such material, $\rho$ is the resistivity of the material, and K is the thermal conductivity thereof.

It has been previously discovered in the art that improved high figure of merit thermoelectric materials may be produced by substitutionally alloying another constituent into the lattice of a semiconductive material, which constituent crystallizes in a similar lattice and has approximately the same lattice constant. Such substitutional alloying decreases the lattice thermal conductivity of the semiconductive material without changing the thermoelectric power thereof for a given resistivity thereby resulting in a material having an increased figure of merit. While such a technique improves the figure of merit of the material, the resulting material is more complex and the problems in the preparation of homogeneous bodies thereof are further increased. For example, one very important group of thermoelectric materials of this type are materials of the bismuth-antimony telluride-selenide system.

Bismuth telluride and alloys of bismuth telluride with bismuth selenide or antimony telluride or both possess a hexagonal crystal structure showing very definite cleavage planes. Further, these materials are known to be anisotropic with respect to their thermoelectric properties with the optimum combination thereof being found when measured in a direction parallel to the cleavage planes. In order to obtain the optimum thermoelectric properties, therefore, the cleavage planes of the material must be oriented parallel to the growth axis of the body of such material.

I have found that it is highly desirable that the body of thermoelectric material be not only homogeneous with respect to its thermoelectric properties but with respect to its composition as well since the temperature dependence of the various thermoelectric parameters ordinarily varies with the composition of the material.

One widely used prior art method of preparing the above thermoelectric materials, often referred to in the art as the "Bridgman technique" involves melting the required proportions of the various constituents of the material in a sealed vessel of quartz or the like, allowing them to react, and then slowly cooling by directional or gradient freezing. Since segregation of certain of the constituents can occur in any such freezing method, the bodies prepared in this manner are often very inhomogeneous. Further, it has been found that different bodies of these materials prepared in substantially the same manner by such method show considerable variation in composition. For example, it is often found in preparing certain thermoelectric materials of the bismuth-antimony telluride-selenide system that the compositional homogeneity of the body may be so poor that one region thereof is of one-type conductivity and the remainder the opposite-type conductivity.

A widely used and important method for the purification of semiconductive materials, metal alloys and the like is known as the "zone melting" process. In general, the zone melting process consists of melting a localized region of an elongated charge or ingot of the material to be purified and passing this molten "zone" through the charge from one end thereof to the other. When the material to be purified, however, is one which contains volatile constituents the process becomes extremely critical in that a very precise control of the partial pressures thereof must be maintained on either side of the molten zone to prevent excessive loss of the volatile constituents therefrom. This is usually accomplished by providing controlled heated regions on either side of the molten zone and maintaining an appropriate partial pressure of the volatile constituent. The resulting composition of the body as well as the homogeneity thereof is very critically dependent upon the control of such partial pressures. Such known prior art methods, therefore, have not been entirely satisfactory in the preparation of homogeneous bodies of materials containing volatile constituents or in consistently reproducing bodies of such materials having substantially the same composition.

It is an object of this invention, therefore, to provide a method of preparing decomposable materials which substantially overcomes one or more of the disadvantages of the prior art.

It is another object of this invention to provide a simplified method of preparing bodies of decomposable materials having compositional homogeneity.

It is a further object of this invention to provide a new, improved and simplified "zoning" method capable of consistently reproducing bodies of decomposable materials having compositional homogeneity.

It is a still further object of this invention to provide a simplified method of preparing thermoelectric materials of the bismuth-antimony telluride alloy system having homogeneity of thermoelectric properties as well as homogeneity of composition.

It is yet another object of this invention to provide a simplified method of providing for a desired orientation of crystals in materials having volatile constituents.

Briefly stated, in accordance with one aspect of this invention, the method of preparing homogeneous bodies of decomposable materials comprises admixing and sealing appropriate proportions of the constituents of the material to be prepared in an evacuated vessel and melting them therein. The melt of the material so produced is then cooled to form, within the sealed evacuated vessel, a freely movable solid body thereof. After such cooling, a narrow zone of the solid body within the evacuated vessel is melted and caused to traverse the body from the bottom to the top thereof.

The solid body within the sealed evacuated vessel is free to move upward to allow for the expansion of the material in the molten zone and serves to seal the melt therein to prevent the escape of the volatile constituents. The resulting bodies produced in accordance with this invention are found to be substantially homogeneous in composition from one end to the other and different bodies produced in a similar manner are found to have substantially the same compositions.

Figure 2:
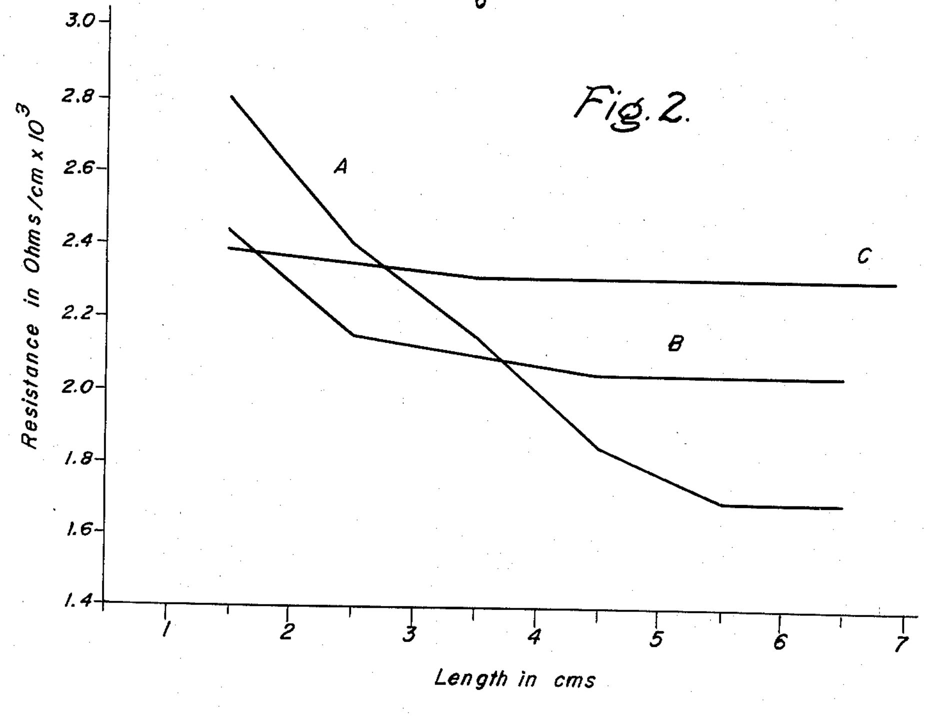

The novel features which are believed characteristic of my invention are set forth with particularity in the appended claims. My invention itself, however, both as to its organization and method of operation, together with further objects and advantages thereof may best be understood by reference to the following description taken in conjunction with the accompanying drawing in which:

FIG. 1 is a diagrammatic sectional view of apparatus suitable for use in the practice of this invention; and, FIG. 2 shows the improved resistance profile of a particular bismuth-antimony telluride alloy prepared in accordance with the method of this invention contrasted with a resistance profile of the same alloy prepared in accordance with a known prior art technique.

In FIG. 1 there is shown, in diagrammatic form, one type of apparatus suitable for carrying out the method of this invention. An evacuable vessel 1 is provided into which appropriate proportions of the constituents of the material to be prepared may be loaded, the vessel evacuated, sealed under vacuum, and the constituents melted therein. The vessel should be of a material capable of withstanding temperatures encountered in suitably melting the constituents of the material to be prepared and which will not react with a melt thereof. Suitable materials, for example, are quartz Vycor, and the like. The melted constituents of the material are cooled and a freely movable solid body 2 of the material is formed thereby within evacuated vessel 1. A narrow horizontal or "pancake" type furnace 3 is provided which has a central aperture 4 therethrough into which the vessel 1 may be lowered causing a narrow molten zone 5 to traverse the body 2 from bottom to top. A suitable furnace for use with a vessel 1 having an outside diameter of 9 millimeters for example, may be one having a thickness of from 1 to 2 inches and a central aperture having a diameter from about ½ to 1½ inches. Any suitable mechanism (not shown) may be employed which is capable of lowering the tube at a desired constant rate. For example, a conventional crystal pulling mechanism of the type well-known in the art may be conveniently adapted and utilized for this purpose.

The method of preparing homogeneous bodies of readily decomposable materials in accordance with this invention comprises admixing appropriate proportions of the constituents of the material to be prepared in an evacuable vessel. A suitable vessel, for example, may be a tube of quartz or other inert material which will not react with a melt of the material being prepared. The loaded vessel is then evacuated to a pressure, for example, of about $10^{-5}$ millimeters of mercury and sealed off under vacuum. The pressure within the tube ordinarily should be at least about $10^{-4}$ millimeters of mercury to assure that the content of oxygen within the tube is small and the formation of metal oxides which may react with the walls of the vessel is substantially avoided.

The sealed, evacuated, loaded vessel is then heated in a suitable furnace as, for example, a horizontal furnace to a temperature above the melting point of the respective constituents to provide within the vessel suitable melt of the material. To assure good mixing of the constituents the vessel may be suitably agitated.

The vessel is then removed from the furnace and allowed to cool so as to form within the vessel a solid body of the material which completely fills the cross section of the vessel and is freely movable therein. For example, the quartz tube may be removed from the furnace, maintained in a vertical position and cooled so that the solid body formed therein fills the entire cross section of the vessel while still being free to move therein.

To assure that there is no reaction between the walls of the vessel and the melt which may cause the solid body formed therein to stick and prevent its free movement within the vessel, I prefer to admix about 0.04 to 0.1 weight percent carbon, in the form of powdered graphite, for example, with the other constituents of the material in the vessel. The carbon does not alter the ultimate composition of the material and assures that the solid body formed within the evacuable vessel, upon cooling of the melt, is freely moveable. Alternatively, this result may be achieved by coating the inside walls of the vessel with a layer of pyrographite before admixing the constituents of the material therein. Yet another alternative for achieving this same result, for example, is to quench the vessel in cold water or the like as soon as the melted material therein has solidified. Conveniently, such quenching may be employed in addition to either of the other alternatives. Other procedures which may be known in the art for achieving this result are also suitable for use in the practice of this invention.

It is important that the solid body formed within the evacuated vessel be freely movable to allow for some movement of the body due to the expansion of the narrow molten zone thereof which follows in a succeeding step of this method and thus assure that the vessel does not break.

A narrow localized region of the body within the evacuated vessel is then melted and caused to traverse the body from the bottom to the top thereof. The solid material seals the melt in the molten zone and prevents the escape of the volatile constituents therefrom. The molten zone, therefore, may be caused to traverse the body without loss of any of the volatile constituents of the material and without the need for providing for regulating the partial pressures of the volatile constituents such as has previously been necessary in methods of this general type known in the prior art.

The rate at which the tube is lowered through the "zone" furnace depends upon the composition of the material being prepared and the effective segregation coefficients of the various constituents thereof. For example, the value of the effective segregation coefficient of a particular constituent depends to some extent upon the mole percentage of that particular constituent present in the material and also upon the crystallization rate; the value of the effective segregation coefficient approaching unity as the growth rate increases. The lowering rate, therefore, is so chosen for the particular material being prepared to assure that substantially no segregation occurs and the resulting body is homogeneous. For example, segregation cannot occur when the effective segregation coefficients of the components of the material are unity.

A suitable lowering rate for a particular bismuth-antimony telluride alloy consisting of 25 mole percent bismuth telluride, 70 mole percent antimony telluride, 5 mole percent antimony selenide, and 1.7 weight percent excess tellurium is in the range of about 6 to 9 centimeters per hour.

Further details about segregation coefficients and the effect of crystallization rate thereon may be had by reference to the book entitled "Zone Melting," by W. G. Pfann, published in 1958 by John Wiley and Sons, Inc., New York, New York.

The molten zone may be caused to traverse the solid body, for example, by causing the vessel containing the solid body therein to be slowly lowered through a "pancake" type furnace capable of maintaining a region therein at a temperature preferably about 50° C. to 100° C. above the melting point of the solid body of material. Thus, as the vessel is lowered this narrow molten zone passes through the body from the bottom to the top thereof. After the vessel has been passed through the heated zone it may be allowed to cool and the body removed therefrom in any suitable manner.

After the initial melting of the constituents and the cooling of the melt formed thereby, there is a considerable free volume present in the vessel above the solid body of material. For example, the initially loaded constituents occupy more of the volume of the vessel than does the solid cast body prepared from them. Since it is desirable that the volume above the solid body be maintained small to prevent the escape of volatile constituents from as large a portion of the top of the body as possible, this free volume is preferably reduced by again sealing the vessel under vacuum relatively close to the top of the body prior to passage of the molten zone therethrough. For example, only sufficient space need be provided to allow for movement of the solid body due to expansion of the material in the molten zone. With this free volume very small, volatile constituents can escape from only the very small portion near the very top of the solid body as it is melted resulting in substantially the entire body having compositional homogeneity.

The improved compositional homogeneity of a body of material prepared in accordance with the method of this invention is shown in FIG. 2. In FIG. 2 curve A represents the resistance profile of a body of P-type conductivity thermoelectric material of the bismuth-antimony telluride system consisting of 68 mole percent bismuth telluride, 32 mole percent antimony telluride, and 2 mole percent excess tellurium prepared in accordance with the directional freezing or so called "Bridgman" technique. Curve B of FIG. 2 illustrates the resistance profile of a body of the same thermoelectric bismuth-antimony telluride alloy which was prepared in accordance with the method of this invention. In both bodies the resistance per centimeter was measured over the entire length of the body with the exception of a small region near each end which could not be accurately measured due to the proximity of the measuring probes to the end clips. At can be observed from curves A and B of FIG. 2 there is a significant improvement in the resistance profile of a body prepared in accordance with this invention. For example, typical resistance profiles of bodies so prepared were relatively flat with a deviation of less than about 10% in the worst sample. Resistance profiles are one indication of the homogeneity of a body of material.

Further, for the particular sample whose resistance profile is shown at A in FIG. 2, a distance of about 1½ centimeters at one end exhibited N-type conductivity while the remainder of the sample was of P-type conductivity. The particular sample whose resistance profile is shown at B in FIG. 2, however, as well as all other samples prepared in accordance with the method of this invention was of P-type conductivity throughout.

In Table I below there is shown the results of an X-ray fluorescent analysis of a body of a thermoelectric material prepared from 25 mole percent bismuth telluride, 70 mole percent antimony telluride, 5 mole percent antimony selenide, and 1.7 weight percent excess tellurium. The results in Table I are given to further illustrate the improved compositional homogeneity of bodies of material prepared in accordance with this invention. For example, although the above thermoelectric alloy has improved thermoelectric properties and homogeneity even when prepared in accord with the known prior art methods, the compositional homogeneity of a body thereof is still further significantly improved when prepared in accordance with the method of this invention. A typical resistance profile of a body of this improved thermoelectric material prepared in accordance with this invention is shown at C in FIG. 2. The above thermoelectric material is disclosed and claimed in my copending application, Serial No. (15D-2861), filed concurrently herewith and assigned to the assignee of this present invention.

The data in Table I below was obtained by subjecting samples taken from both ends and from the middle of the body to an X-ray fluorescence method of analysis.

TABLE I

| | Sprout | Middle | Seed |
|---|---|---|---|
| Te/Bi | 4.53 | 4.44 | 4.51 |
| Te/Sb | 1.63 | 1.53 | 1.55 |
| Te/Se | 5.15 | 4.53 | 6.10 |

The results in Table I show that the ratio of tellurium to bismuth and the ratio of tellurium to antimony are substantially constant over the entire body. The scatter shown for the ratio of tellurium to selenium can be accounted for as inaccuracies in determination since the amount of selenium in the various samples was extremely small. The bodies prepared in accordance with the method of the present invention, therefore, are substantially homogeneous with regard to all constituents.

In one specific example, a thermoelectric material consisting of 68 mole percent bismuth telluride, 32 mole percent antimony telluride, and 2 mole percent excess tellurium was prepared in accordance with the method of this invention in the following manner:

*Example I*

A seven millimeter inside diameter quartz tube sealed at one end was cleaned with a nitric-hydrofluoric acid solution, rinsed in distilled water, rinsed again in acetone and dried by evacuation. 9.55 grams of bismuth, 2.61 grams of antimony, 12.89 grams of tellurium, and 0.010 grams of powdered graphite were loaded and admixed in the quartz tube which was then evacuated to a pressure of about $10^{-5}$ millimeters of mercury and sealed off under vacuum. The loaded, evacuated tube containing the appropriate proportions of the constituent elements of the material being prepared was placed in a horizontal furnace of conventional type maintained at a temperature of about 750 to 800° C. for approximately 2 hours where the constituents melted and reacted to form a melt of the material. The tube was agitated within the furnace from time to time to assure good mixing of the constituent elements.

At the end of the reaction period the tube was removed from the furnace and placed in a vertical position while cooling so that a solid ingot completely filling the cross-sectional area of the tube was formed therein. As soon as the material had solidified the tube was quenched in cold water.

The free volume above the solid ingot was reduced by again sealing off the tube under vacuum about 10 millimeters above the top of the ingot. The sealed, evacuated tube containing the ingot of the material was then lowered at a constant rate of about 8 centimeters per hour through a narrow zone furnace maintained at a temperature of about 700° C. which was about 90° C. above the melting point of the ingot. The furnace was of the "pancake" type about 2 inches in thickness and having a central bore therethrough about 1½ inches in diameter. When the entire length of the tube was lowered through the furnace the ingot was removed therefrom. Although in this specific example, the ingot was easily removed by sliding the tube therefrom, irregularities in the bore of the tubing often makes it necessary to break the quartz tube from the ingot to effect its removal.

The resistance profile of the resulting ingot is shown by B in FIG. 2. The data for the resistance profile was obtained by measuring the resistance per centimeter over the entire ingot using a Keithley model 502 milliohmmeter.

*Example II*

A thermoelectric material was prepared from 25 mole percent bismuth telluride, 70 mole percent antimony telluride, 5 mole percent antimony selenide and 1.7 weight percent excess tellurium in accordance with this invention in the following manner.

A quartz tube sealed at one end having a 9 millimeter outside diameter and a 7 millimeter inside diameter was cleaned with a nitric-hydrofluoric acid solution, rinsed in distilled water, rinsed again in acetone and dried by evacuation. 3.94 grams of bismuth, 6.89 grams of antimony, 14.15 grams of tellurium and 0.45 grams of selenium were loaded and admixed in the quartz tube which was then evacuated to a pressure of about $10^{-5}$ millimeters of mercury and sealed off under vacuum. The sealed tube containing the appropriate proportions of the material being prepared was placed in a horizontal furnace maintained at a temperature of about 750° C. for approximately 2 hours where the constituents melted and reacted to form a melt of the material within the tube. The tube was suitably agitated from time to time to assure good mixing of the constituents.

At the end of the reaction period the tube was removed from the furnace, placed in a vertical position while cooling so that a solid ingot completely filling the cross-sectional area of the tube was formed therein. As soon as the material within the tube had solidified the tube was plunged into cold water to assure that the solid ingot was free to slide up and down within the tube.

The free volume above the solid ingot was reduced by again sealing off the tube under vacuum about 10 millimeters above the top of the ingot. The tube containing the freely sliding solid ingot therein was then lowered through a narrow zone furnace at a constant rate of about 8 centimeters per hour. The temperature of the narrow heated zone was maintained at a temperature of about 700° C. which was about 90° C. above the melting point of the solid ingot. The narrow zone furnace was of the "pancake" type about 1 inch in thickness and having a central bore therein about ½ inch in diameter. A narrow molten zone of the material was thus caused to traverse the solid ingot within the sealed tube from the bottom to the top thereof. When the entire length of the ingot had been lowered through the furnace the ingot was removed from the tube. Samples were taken from both ends and from the middle of the ingot and analyzed by the X-ray fluorescence method. The results of this analysis are shown in Table I of this specification, and illustrate the improved compositional homgeneity of a body of material prepared in accordance with the method of this invention.

The resistance profiles shown by curves B and C in FIG. 2 and the ratios of the constituents of a sample which are shown in Table I illustrate the substantial compositional homogeneity of ingots prepared in accordance with the method of this invention. For example, the entire body of the material prepared in accordance with this method is found to be at least as good as the very best portions of material prepared by the prior art directional freezing method.

There has been described herein, therefore, a new and simplified method of preparing bodies of decomposable materials having compositional homogeneity. Further, the method is capable of consistently reproducing bodies of such material which have substantially the same composition from one such body to the other. More particularly, there has been described a new and simplified method of preparing bodies of thermoelectric materials, having volatile constituents, which bodies exhibit homogeneity of composition as well as homogeneity of thermoelectric properties.

While the invention has been described hereinbefore with respect to specific examples and certain preferred embodiments thereof, many changes and modifications will occur to those skilled in the art. It is, therefore, to be understood that the appended claims are intended to cover all such modifications and changes as fall within the true spirit and scope of the invention.

What I claim as new and desire to secure by Letters Patent of the United States is:

1. The method of producing homogeneous bodies of readily decomposable materials which comprises: sealing appropriate proportions of the constituents of said material in an evacuated vessel; melting said constituents within said evacuated vessel to produce a melt of said material therefrom; cooling the material so produced within said vessel to cause the formation therein of a solid body of said material which completely fills the cross section of said vessel while being freely movable therein from the bottom to the top thereof; and lowering said sealed evacuated vessel with said body therein through a narrow heated zone to cause a narrow molten zone of said material to traverse said body from the bottom to the top thereof, said narrow molten zone being confined between the adjacent solid portions of said body and the walls of said vessel.

2. The method of producing homogeneous bodies of readily decomposable materials which comprises: sealing appropriate proportion of the constituents of said material in an evacuated vessel; heating said constituents within said vessel to a temperature above the respective melting points to form an alloy thereof; cooling said vessel to cause the formation therein of a solid body of said material which completely fills the cross section of said vessel and is freely movable therein from the bottom to the top thereof; melting a narrow zone of the body so formed within said evacuated vessel said narrow molten zone being confined between the adjacent solid portions of said body and the walls of said vessel; and causing said molten zone to traverse said body vertically from bottom to top thereof at a rate sufficient to prevent segregation and produce a homogeneous body of said material.

3. The method of preparing homogeneous bodies of readily decomposable materials which comprises: sealing appropriate proportions of the constituents of said material together with from about 0.04 to 0.1 weight percent of powdered graphite in an evacuated vessel; melting said constituents within said evacuated vessel to produce a melt of said material therein; cooling the material so produced within said evacuated vessel to cause the formation therein of a solid body of said material which completely fills the cross section of said vessel and is freely movable therein from bottom to top; and lowering said evacuated vessel with said body therein through a narrow heated region to cause a narrow molten zone of said material confined between adjacent solid portions of said body and the walls of said vessel to traverse said body from the bottom to the top thereof at a rate sufficient to prevent substantial segregation and provide a body having substantially homogeneous composition from one end thereof to the other.

4. The method of preparing homogeneous bodies of readily decomposable materials which comprises: sealing the appropriate proportions of the constituents of the material to be prepared together with from about 0.04 to 0.1 weight percent graphite in an evacuated vessel; mixing and melting said constituents within said evacuated vessel to produce a melt of said material therein; cooling the melt so prepared while maintaining said vessel in a position to assure the formation therein of a solid body of said material which completely fills the cross section of said vessel and is freely movable therein from bottom to top; and passing said evacuated vessel with said body therein through a narrow heated region to cause a narrow zone of said body to be melted and to traverse said body from the bottom to the top thereof, said narrow molten zone being confined between the adjacent solid portions of said body and the walls of said vessel and traversing said body at a rate sufficient to prevent segregation and cause the composition of said body to be substantially homogeneous.

5. The method of preparing homogeneous bodies of readily decomposable materials which comprises: admixing the appropriate proportions of the constituents of the material in an evacuable vessel; evacuating said vessel to a pressure less than about $10^{-4}$ millimeters of mercury; sealing said evacuated vessel to contain said constituents therein at said low pressure; heating said vessel to a temperature above the respective melting points of the constituents to form a melt of said material within said vessel; removing said vessel to ambient temperature and maintaining same in a position to assure the formation therein of a solid body of said material which completely fills the cross-sectional area of said vessel and is freely movable from top to bottom therein; and causing a narrow molten zone of said material to traverse said body from the bottom to the top thereof, said narrow molten zone being confined between the adjacent solid portions of said body and the walls of said vessel and traversing said body at a rate sufficient to prevent substantial segregation of any of the constituents thereof.

References Cited by the Examiner

UNITED STATES PATENTS

| | | | |
|---|---|---|---|
| 2,789,039 | 4/57 | Jensen | 148—1.6 X |
| 2,840,496 | 6/58 | Jenny | 148—1.5 |
| 2,933,384 | 4/60 | Welker et al. | 148—1.6 X |
| 2,944,975 | 7/60 | Folberth | 148—1.6 X |

OTHER REFERENCES

Vernon: "Growth of Uniform Circular Cylindrical Crystals of Predetermined Orientation," Journal of Scientific Instruments, vol. 36, April 1959, pp. 198 and 199.

Lawson: "A Method of Growing Single Crystals of Lead Telluride and Lead Sulfide," Journal of Applied Physics, vol. 22, No. 12, December 1951, pp. 1444–1447.

DAVID L. RECK, *Primary Examiner.*

RAY K. WINDHAM, HYLAND BIZOT, *Examiners.*